United States Patent [19]

Calbert et al.

[11] 4,314,628
[45] Feb. 9, 1982

[54] FEED AND STORAGE TRACK FOR DIP DEVICES

[75] Inventors: Raymond E. Calbert, Escondido; Herbert E. Morse, San Diego, both of Calif.

[73] Assignee: Delta Design, Inc., San Diego, Calif.

[21] Appl. No.: 165,785

[22] Filed: Jul. 3, 1980

Related U.S. Application Data

[63] Continuation of Ser. No. 942,060, Sep. 13, 1978, abandoned.

[51] Int. Cl.³ .............................................. B65G 11/00
[52] U.S. Cl. .................................. 193/2 R; 221/312 R
[58] Field of Search ................. 193/38, 1 JR, 2 B, 40, 193/41, 39, 25 R, 25 FE; 221/312 R, 312 A, 312 C, 242, 123, 92; 211/26, 162; 33/168 R; 209/911, 573, 574

[56] References Cited

U.S. PATENT DOCUMENTS 3,341,928  9/1967  Naumann ....................... 209/573 X
3,727,757  4/1973  Boissicat ............................ 209/573

Primary Examiner—Robert B. Reeves
Assistant Examiner—Gene A. Church
Attorney, Agent, or Firm—Brown & Martin

[57] ABSTRACT

A feed and storage track which will hold DIP devices of three different widths in aligned rows, such as during treatment in an environmental chamber, and which will facilitate precise individual feed of the devices to a handling or testing station. The track has three rails with spacings to fit the three sizes of DIP devices straddling specific pairs of rails. A three pronged input head is adjustably mounted on one end of the track to feed DIP devices from a standard storage sleeve onto the appropriate rails.

5 Claims, 11 Drawing Figures

U.S. Patent Feb. 9, 1982 Sheet 1 of 2 4,314,628
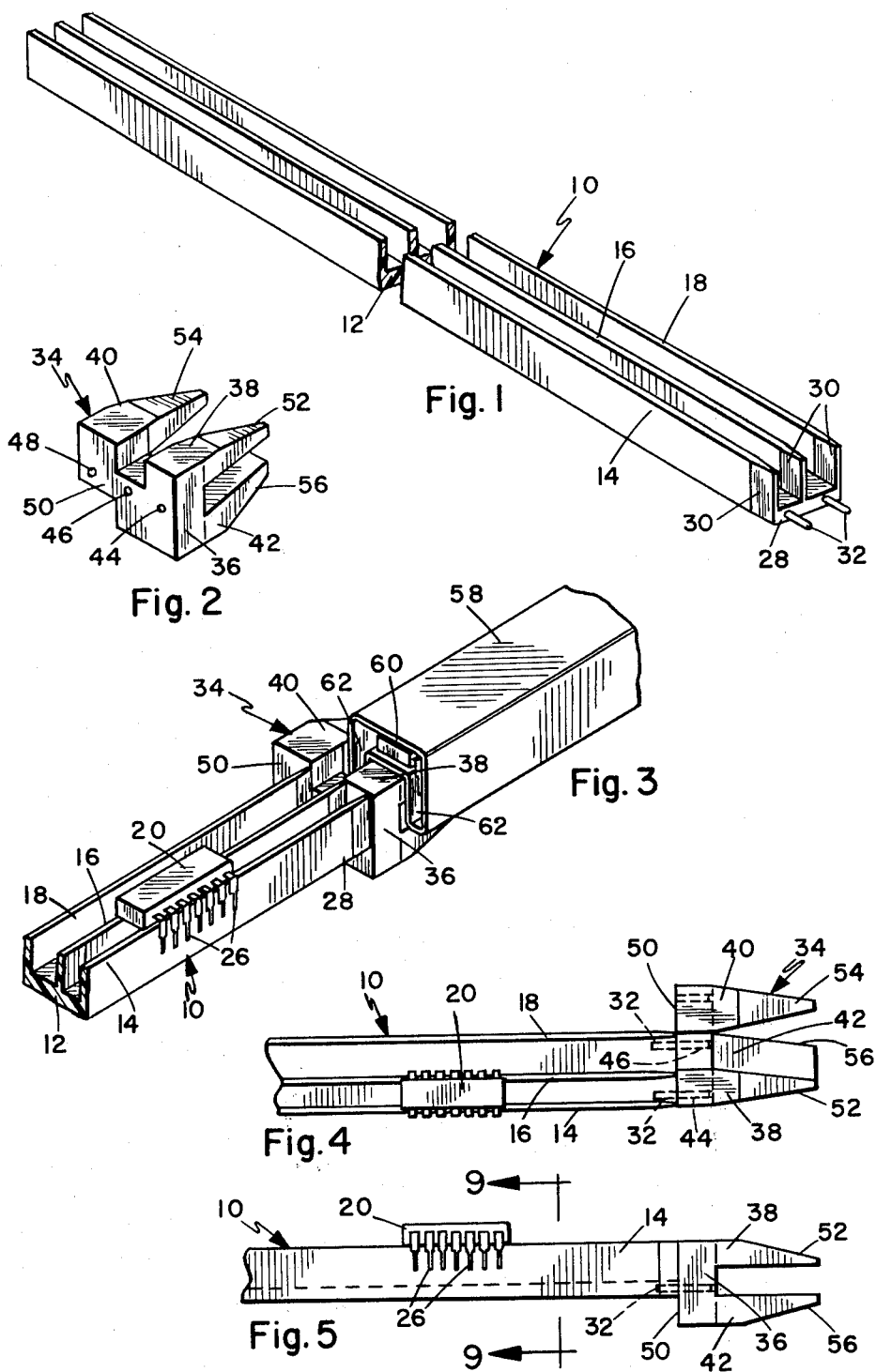

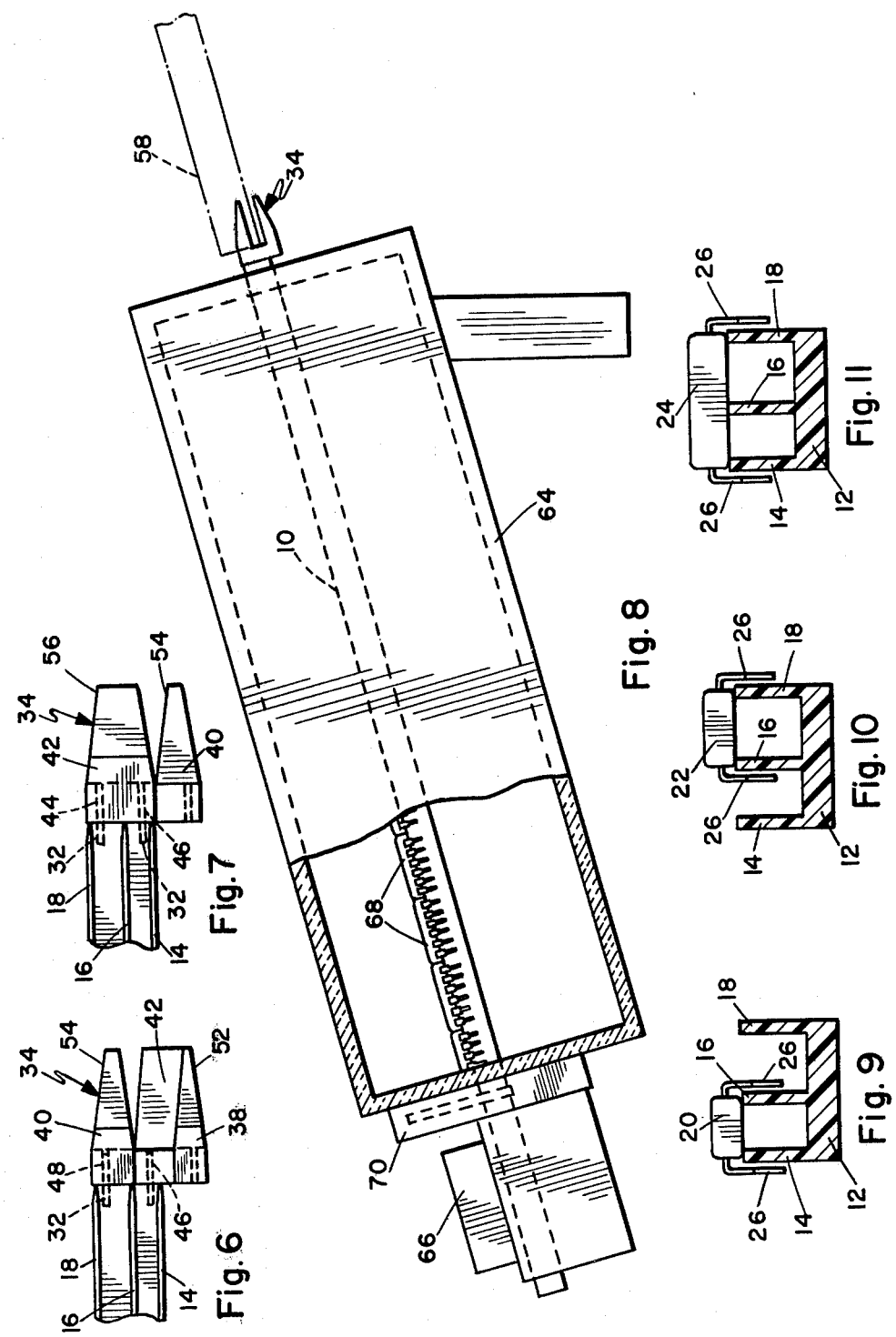

FEED AND STORAGE TRACK FOR DIP DEVICES

This is a continuation of application Ser. No. 942,060 filed Sept. 13, 1978, now abandoned.

BACKGROUND OF THE INVENTION

In electronic circuitry, many integrated circuit components are encapsulated in a dual in-line package, or DIP, which has rows of connecting legs or pins projecting from opposite sides and extending below the package in two parallel rows. The widths of the packages and spacings between the rows of pins have been standardized and the three most common widths are 300, 400 and 600 mils.

DIP devices are tested after encapsulation in apparatus which contacts all of the pins while the individual device is held in a positioning jig. The devices are usually subjected to a particular environment for testing, such as a specific high or low temperature, which requires the devices to be heat soaked and stabilized in an environmental chamber prior to testing. The devices are normally stored in the chamber on some type of track, from which the individual devices are fed to the handling and testing station. Precise alignment is necessary for moving the devices, since they are quite small and the connecting pins are delicate and easily bent.

Apparatus in present use utilizes tracks which will handle only a single size of DIP, or occasionally two sizes. To accommodate other sizes, many parts of the apparatus must be changed, if this is possible in the design. In view of the large number of DIP devices which are currently used, it would be very advantageous to have apparatus which would handle the three common sizes with a minimum of adjustment.

SUMMARY OF THE INVENTION

The feed and track structure described herein is capable of handling 300, 400 and 600 mil DIP devices by merely setting a multiple position input head, which takes only a few seconds. The track has three rails which are spaced so that specific pairs of the rails will receive DIP devices straddling the rails of the appropriate spacing, allowing the devices to slide smoothly along the track in precise alignment.

In a typical apparatus the track would extend through an environmental chamber, with one end projecting for input of the devices and the other end leading to a testing station. In the input end the track has an input head with three projecting prongs corresponding to the three widths of the DIP devices. The head is attached to the track by retaining pins and is easily adjustable to align each prong with the correspondingly spaced pair of rails. Each prong is tapered to receive and guide the end of a standard DIP storage sleeve into alignment with the appropriate rails, for smooth transfer of the devices from the storage sleeve to the track.

The track and input head are compatible with existing DIP storage and handling techniques and are readily adaptable to a variety of environmental testing apparatus.

The primary object of this invention, therefore, is to provide a new and improved feed and storage track for DIP devices.

Another object of this invention is to provide a feed and storage track which will accommodate three basic sizes of DIP devices.

Another object of this invention is to provide a feed and storage track having an adjustable input head for guiding DIP devices onto the appropriate portion of the track.

A further object of this invention is to provide a feed and storage track which is adaptable to existing DIP handling techniques and apparatus.

Other objects and advantages will be apparent in the following detailed description, taken in conjunction with the accompanying drawings, in which:

FIG. 1 is a perspective view of the track.

FIG. 2 is a perspective view of the input head.

FIG. 3 is a perspective view showing the input head attached to the track, with a sleeve of DIP devices in place to feed onto the track.

FIG. 4 is a top plan view of a portion of the track with the input head attached in position to receive 300 mil DIP devices.

FIG. 5 is a side elevation view of the structure of FIG. 4.

FIG. 6 is a view similar to FIG. 4, but with the input head positioned to receive 400 mil DIP devices.

FIG. 7 is a view similar to FIG. 4, but with the input head positioned to receive 600 mil DIP devices.

FIG. 8 is a side elevation view, partially cut away, of a typical environmental chamber and test station, with the feed and track installed.

FIG. 9 is an enlarged sectional view taken on line 9—9 of FIG. 5.

FIGS. 10 and 11 are similar sectional views showing the positioning of other sizes of DIP devices.

DESCRIPTION OF THE PREFERRED EMBODIMENT

The track 10 is a simple extruded member of any required length with a base 12 and three longitudinal parallel rails 14, 16 and 18 projecting from one side of the base. Outer rail 14 extends along one edge of base 12 and outer rail 18 along the other edge, with intermediate rail 16 in between. The spacing between the outer faces of the first pair of rails 14 and 16 is slightly less than 300 mils, so that a 300 mil DIP device 20 can straddle those two rails, as in FIGS. 4 and 9. The spacing between the outer faces of the second pair of rails 16 and 18 is slightly less than 400 mils, so that a 400 mil DIP device 22 can straddle those two rails, as in FIG. 10. Further, the thickness of the rails is such that the spacing between the outer faces of the third pair of rails 14 and 18 is slightly less than 600 mils, to accommodate a 600 mil DIP device 24, as in FIG. 11.

All of the DIP devices have two rows of connecting pins 26, the number of pins in each row depending on the size of the package and the nature of the circuit involved. However, considerable standardization has been developed to allow the use of standard sockets and pin spacings in printed circuit boards. The width or spacing between the rows of connecting pins has been closely standardized, the most common sizes being the 300, 400 and 600 mil sizes for which the track is designed.

At one end, designated as the input end 28, the rails have tapered ends 30 to reduce the thickness and eliminate square edges, on which the DIP devices might hang up. The other ends of the rails could be similarly tapered if necessary.

Projecting from the base 12 at the input end 28 are two spaced retaining pins 32, to receive the input head 34 shown in FIG. 2. The input head can be seated on pins 32 in three different positions to feed DIP devices onto the appropriate pair of rails.

Input head 34 comprises a block portion 36 with three prongs 38, 40 and 42 projecting from one side. Block portion 36 has three equally spaced sockets 44, 46 and 48 in a row across the rear face 50, to seat on pins 32 in either of two laterally offset positions.

Prong 38 is slightly less than 300 mils wide at rear face 50 to match the spacing of rails 14 and 16. and has a tapered forward wedge portion 52. Prong 40 is laterally spaced from prong 38 and has a width of slightly less than 400 mils at rear face 50, to match the spacing of rails 16 and 18. Prong 40 has a tapered forward wedge portion 54. Prong 42 is vertically spaced from prong 38 and has a width of slightly less than 600 mils at rear face 50 to match the spacing of rails 14 and 18. Prong 42 has a tapered forward wedge portion 56.

The prongs are positioned relative to sockets 44, 46 and 48 so that, when input head 34 is seated on the track with pins 32 in the sockets 44 and 46, as in FIG. 4, the prong 38 is aligned with the pair of rails 14 and 16. In FIG. 6 the input head is shown with the pins 32 in sockets 46 and 48, so that prong 40 is aligned with the pair of rails 16 and 18. In FIG. 7 the input head 34 is inverted and seated with pins 32 in sockets 44 and 46, so that prong 42 is aligned with the outer pair of rails 14 and 18. Thus by simply positioning the input head 34 on the end of the track 10, any of three sizes of DIP devices can be fed onto the appropriate pair of rails. For compactness the prongs are arranged in the horizontally and vertically spaced group as shown, but could be in a single row if desired.

The input feed technique is illustrated in FIG. 3. DIP devices are normally stored in plastic sleeves, such as the sleeve 58, for protection during handling and shipping. The sleeve 58 is generally U-shaped in cross section and double walled, so that the encapsulated portion of the DIP slides in an upper channel 60 and the connecting pins are enclosed in depending side channels 62.

To feed DIP devices onto the track, the sleeve 58 is placed over the appropriate prong of the input head 34 and pushed against the block portion 36. The wedge portion of the prong guides the sleeve into alignment so that the DIP devices can slide out of the sleeve, over the prong and onto the track.

In the installation shown in FIG. 8, the DIP devices would feed by gravity from the sleeve 58 to the inclined track 10. However, any suitable feed means, such as a vibrator, may be used to move the devices. In FIG. 8 the track is shown extending through an environmental chamber 64, in which temperature and other conditions can be controlled, the apparatus being well known. Input end 28 and the input head 34 are accessible at one end of the chamber for easy change of the head. At the other end of the chamber 64 is a testing unit 66 into which DIP devices 68 are released one at a time by a suitable gate mechanism 70. Various types of test equipment and feed control means are in use in existing apparatus. The testing unit usually has interchangeable or adjustable parts for different numbers of pins and pin spacings, and can be set up for a particular run of one type of device. With the novel track and feed arrangement it is not necessary to change any other structural parts. The environmental chamber can thus be left undisturbed.

It will be evident that the feed and track structure is adaptable to many different types of apparatus in which DIP devices of different sizes must be handled, stored, or transferred from one location to another. On the selective width track the devices are always held in close alignment, which facilitates pick-off or other types of handling at various stations. As used herein the terms outer and intermediate rails are relative terms and do not limit the device to a three rail configuration.

Having described my invention, I claim:

1. Feed and track means for handling dual in-line packaged electronic devices of different widths, each having a generally rectangular shaped body with a plurality of electrical conductors extending downwardly from two opposite sides thereof, comprising:

an elongated track means having a plurality of longitudinally extending rails fixed in parallel spaced relation and including a pair of outer rails and an intermediate rail between the outer rails;

one of said outer rails and the intermediate rail forming a first pair of rails with a spacing therebetween to accommodate a first size of dual in-line packaged device straddling the first pair of rails;

the other outer rails and the intermediate rail forming a second pair of rails with a spacing therebetween to accommodate a second size of dual in-line packaged device straddling the second pair of rails;

the two outer rails forming a third pair of rails having a spacing therebetween for accommodating a third size of dual in-line packaged device straddling the third pair of rails;

said track having an input end;

and an input head adjustably mounted on said input end with guide means thereon for guiding dual in-line packaged devices onto a selected pair of rails.

2. Feed and track means according to claim 1, wherein said guide means comprises three prongs projecting from said input head, each prong having a width equal to the spacing of a particular one of said pairs of rails.

3. Feed and track means according to claim 2, and including retaining means on said track for holding said input head thereon in selective positions with each prong aligned with the related pair of rails.

4. Feed and track means according to claim 3, wherein said retaining means comprises pins projecting from said input end, said input head having sockets to recive said pins in the selective positions of the input head relative to the track.

5. Feed and track means according to claim 2, wherein each of said prongs has a tapered wedge portion for receiving and guiding a sleeve containing dual in-line packaged devices into alignment with the respective pair of rails.

* * * * *